United States Patent [19]

Kasuya

[11] Patent Number: 4,536,881
[45] Date of Patent: Aug. 20, 1985

[54] INTEGRATED LOGIC CIRCUIT ADAPTED TO PERFORMANCE TESTS

[75] Inventor: Yoshihiro Kasuya, Tokyo, Japan

[73] Assignee: Nippon Electric Co., Ltd., Japan

[21] Appl. No.: 545,608

[22] Filed: Oct. 27, 1983

Related U.S. Application Data

[60] Continuation of Ser. No. 409,787, Aug. 20, 1982, abandoned, which is a division of Ser. No. 130,687, Mar. 17, 1980, Pat. No. 4,366,393.

[30] Foreign Application Priority Data

| Mar. 15, 1979 [JP] | Japan | 54-30243 |
| Mar. 15, 1979 [JP] | Japan | 54-30253 |
| Mar. 15, 1979 [JP] | Japan | 54-30254 |
| Mar. 15, 1979 [JP] | Japan | 54-30256 |

[51] Int. Cl.³ .......................................... G11C 19/00
[52] U.S. Cl. ..................................... 377/70; 377/72; 377/81
[58] Field of Search ............ 377/70, 72, 80, 81; 307/445; 324/73 PC

[56] References Cited

U.S. PATENT DOCUMENTS

| 3,258,696 | 6/1966 | Heymann | 377/73 |
| 3,535,642 | 10/1970 | Webb | 377/72 |
| 3,651,315 | 3/1972 | Collins | 324/73 PC |
| 3,911,330 | 10/1975 | Fletcher et al. | 377/72 |
| 3,924,144 | 12/1975 | Hadamard | 307/221 R |
| 3,958,110 | 5/1976 | Hong et al. | 371/15 |
| 4,139,318 | 2/1979 | Schneider | 324/73 PC |
| 4,213,007 | 7/1980 | Funk | 371/22 |

Primary Examiner—Stanley D. Miller
Assistant Examiner—B. P. Davis
Attorney, Agent, or Firm—Sughrue, Mion, Zinn, Macpeak, and Seas

[57] ABSTRACT

An easily testable integrated logic circuit utilizes a plurality of flip-flops to form a feedback shift register. In some embodiments, means are provided for selectively forming the flip-flops into a feedback shift register and for selectively supplying either the flip-flop contents or a random signal as partial inputs to the combinational logic circuit. In other embodiments, the feedback shift register is coupled to the AND logic array outputs of a combinational circuit which also includes and OR logic array.

5 Claims, 12 Drawing Figures

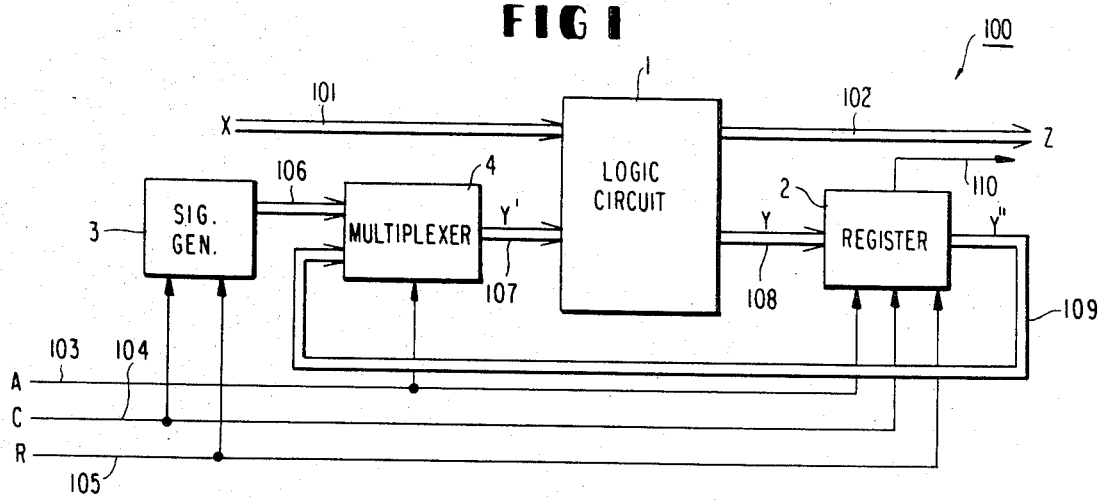
FIG 1
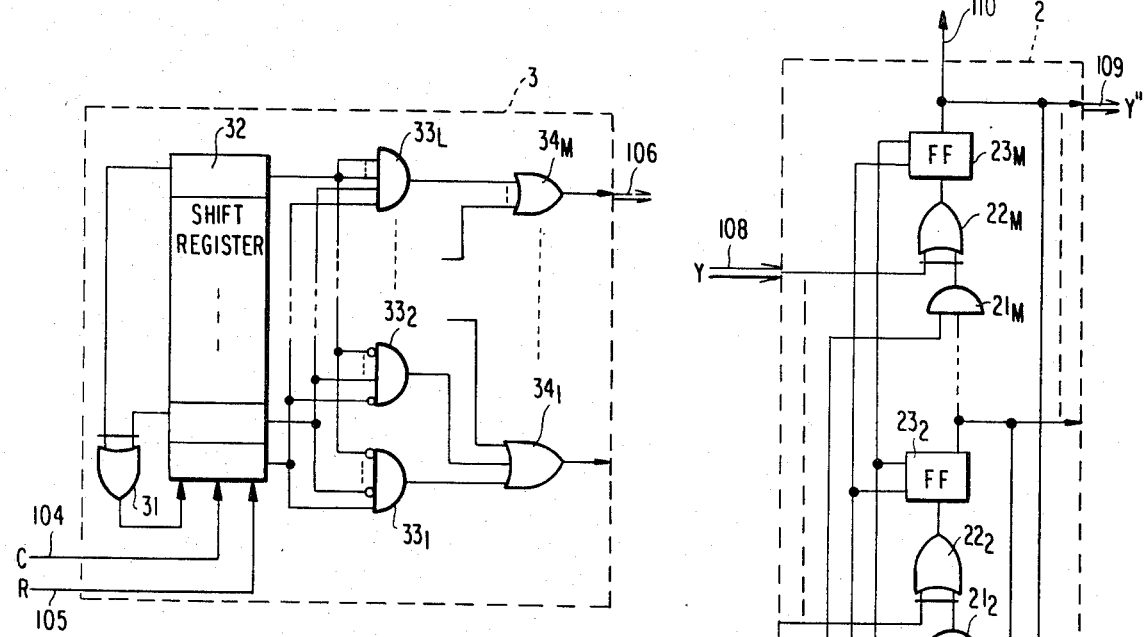
FIG 2
FIG 3
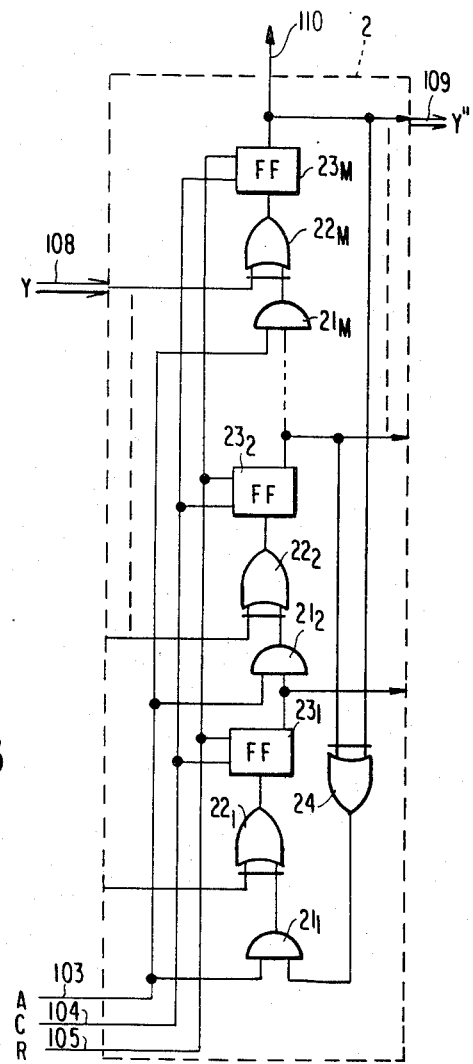

FIG 10
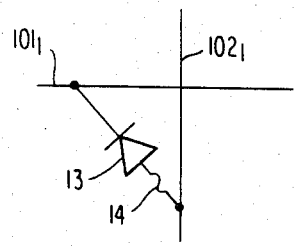
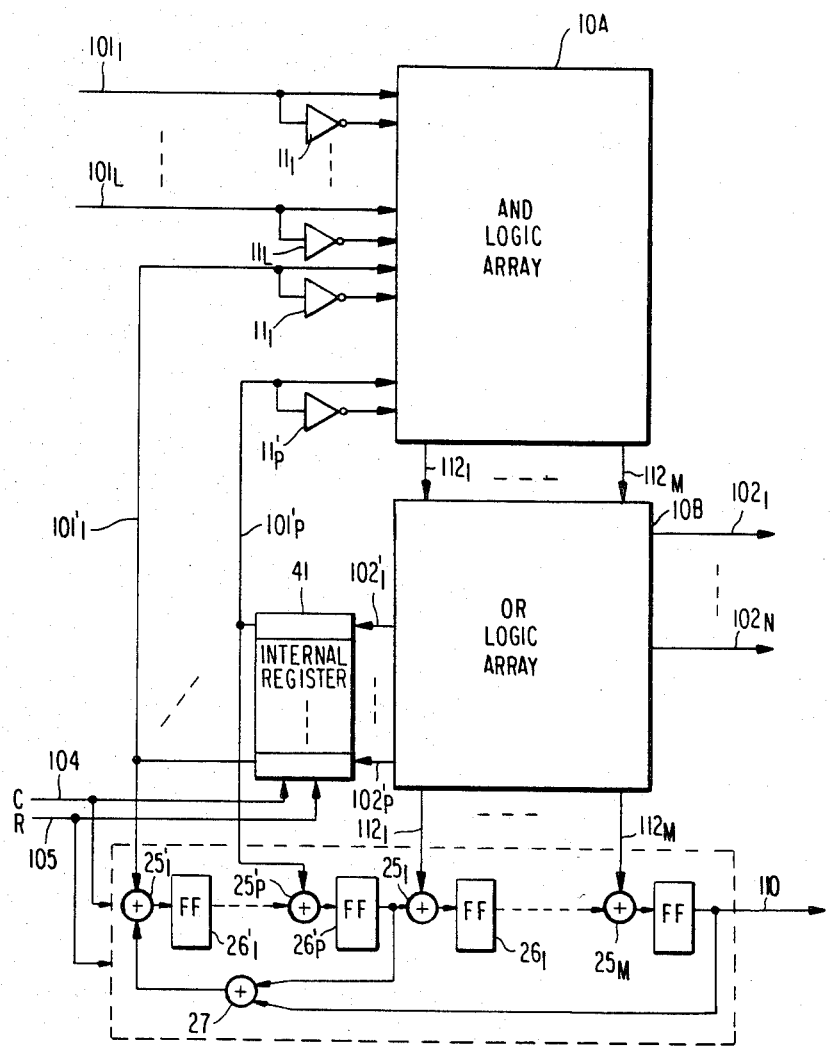
FIG 11

INTEGRATED LOGIC CIRCUIT ADAPTED TO PERFORMANCE TESTS

This application is a continuation of application Ser. No. 409,787, filed Aug. 20, 1982, now abandoned, which is a division of application Ser. No. 130,687, filed Mar. 17, 1980, now U.S. Pat. No. 4,366,393.

BACKGROUND OF THE INVENTION

The present invention relates to readily testable integrated logic circuits, and more particularly to general-purpose integrated logic circuits of systematic structure having built-in flipflops, whose structural elements can be readily tested for correct operation.

While circuit integration technology has achieved remarkable progress over recent years, successfully realizing high-density integration of highly complex logic functions, detection of faulty elements has been made even more difficult by such constraints as circuit complexity, limitation on the number of input and output terminals and the impossibility of directly inspecting the internal structure. Programmable logic arrays (hereinafter abbreviated to PLAs) find increasingly extensive use as general-purpose integrated logic circuit elements because of their versatility and design facility. They so much the more require ready detection of faulty elements.

However, testing a large integrated logic circuit with respect to all possible input combinations would take an enormous length of time. More recently, there have emerged PLAs which, having built-in flipflops, permit composition of sequential circuits capable or more complex logical operations, and their testing is even more difficult. These integrated logic circuits are, therefore, so designed in advance as to allow ready examination of faulty elements whenever they arise.

Conventional circuit structures to facilitate testing of integrated logic circuits include one, as shown in the U.S. Pat. No. 3,958,110 entitled LOGIC ARRAY WITH TESTING CIRCUITRY issued to Hang et. al, in which outputs of specific signal lines (for example, the product term lines of an AND logic array) are received by a shift register whose content is led out. In another system known as the SCAN-PATH system, a group of flipflops which are present as internal memory elements for sequential circuit performance are interconnected to constitute the shift register for the testing purpose.

Both of these systems can give a large number of test outputs with the addition of a small number of observation terminals by taking out through a shift register the internal information of the circuit which is directly inaccessible, and thereby improve the testing capability. The SCAN-PATH system, in which the test input is inserted into the feedback loop by writing it into the shift register, can test even a sequential circuit performing complex logical operations merely as a combinational circuit.

These systems using a shift register, however, require advance preparation of the test inputs. Moreover, since information is written into or read out of the shift register in a scanning manner every time the test input is entered and the test result collected, not only extra time spent in testing but also it is impossible to perform dynamic testing of circuit functions under their real conditions.

SUMMARY OF THE INVENTION

An object of the present invention, therefore, is to provide a testable integrated logic circuit which can make available a test input without requiring preparation and yet enable any fault to be examined in a dynamic state of high-speed circuit performance.

In accordance with this invention, there is provided a readily testable logic circuit comprising: a group of flipflops for feeding partial outputs of a combinational circuit back as partial inputs to said combinational logical circuit; a random signal generator circuit; means for composing said group of flipflops into a feedback shift register in response to an input control signal; means for applying said partial output signals of said combinational circuit to said feedback shift register by modulo 2 addition for each bit; and means for selectively applying one of said output signals of said group of flipflops and said random signal as a partial input of said combinational circuit. In a routine operation, the output signals of said group of flipflops are applied to the input of said combinational logical circuit. In testing, the random signal is applied to said combinational circuit and the partial output signals of said combinational logical circuit are accumulated in the feedback shift register, thereby to facilitate observation of the test results.

Testing of the integrated logic circuit of the present invention can be achieved by utilizing a different circuit structure from that operating in regular operation, i.e., by cutting off the feedback loop of the sequential circuit to separate the combinational circuit, using random signals as test input and further utilizing the group of flipflops, present as internal memory elements, as means for collecting the test results.

BRIEF DESCRIPTION OF THE DRAWINGS

The above and other objects, features and advantages of this invention will be understood from the following detailed description of preferred embodiments of this invention taken in conjunction with the accompanying drawings, wherein:

FIG. 1 is a block diagram of a first embodiment of this invention;

FIG. 2 is a block diagram of the random signal generator 3 used in the first embodiment shown in FIG. 1;

FIG. 3 is a block diagram of the register 2 used in the first embodiment shown in FIG. 1;

FIG. 10 illustrates an example of a diode matrix; and

FIGS. 11 and 12 are block diagrams of fourth and fifth embodiments, respectively, of this invention.

DETAILED DESCRIPTION OF THE PREFERRED EMBODIMENTS

Figure 4:
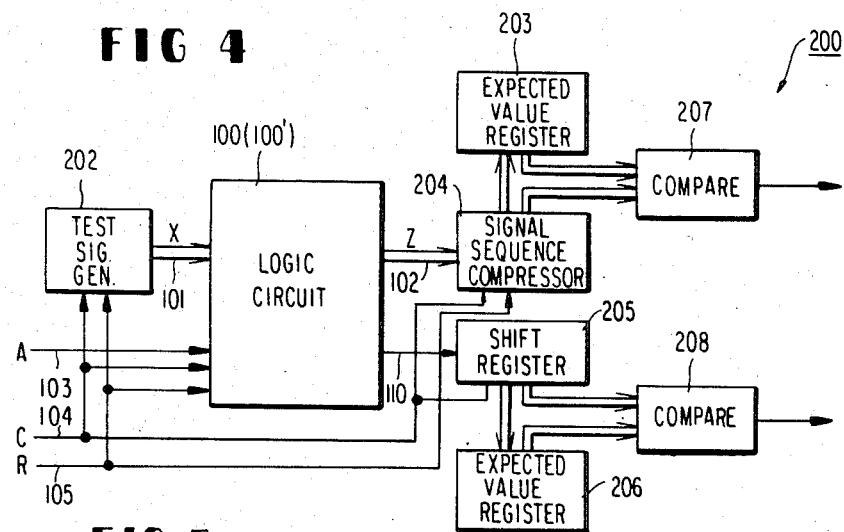
FIG. 4 is a block diagram of a testing device for the integrated logic circuit 100 of the first embodiment of this invention.

Referring now to FIG. 1, the first embodiment 100 comprises a multi-input, multi-output combinational logic circuit 1, which can be of any structure appropriate for the logic functions to be realized, e.g. and AND logic array and OR logic array in a PLA. The logic circuit 1 logically combines an external input X and a feedback input Y' and supplies an external output Z and a flipflop-driving signal Y. A register 2 includes a group of flipflops corresponding to the internal memory elements of a sequential circuit, and is also used as a compressor for the signal sequence.

The first embodiment 100 further comprises signal lines 101 for supplying the external input X, signal lines 102 for supplying the external output Z, signal lines 107 for supplying the feedback input Y', signal lines 108 for supplying the flipflop-driving signals Y and signal lines 109 feeding back the output Y'' of the register 2 to the input of the combinational circuit 1, and each of these signal lines 101, 102, 107, 108 and 109 transmits a plurality of signals. The integrated logic circuit 100 is a synchronous type and comprises signal line 104 for supplying a sync signal C from outside and signal lines 105 for supplying an initializing signal R to initialize the integrated logic circuit 100.

In order to distinguish testing from routine operation, a signal line 103 is provided for supplying a mode switching signal A to command switching between the routine operation and testing modes. A random signal generator 3 generates a random signal for the testing purpose. A multiplexer 4 selectively supplies the combinational logical circuit 1 with one of the random signal from the random signal generator 3 and the output Y'' from the register 2, respectively supplied through signal lines 106 and 109. A signal line 110 is provided for leading out the test result from the register 2.

With reference to FIG. 2, the random signal generator 3 has a shift register 32 and an EXOR (exclusive OR) circuit 31. A linear feedback shift register is constituted by the shift register 32 and the EXOR circuit 31, in which signals at specific bit-positions in the shift register 32 are fed back through the EXOR circuit 31, whereby pseudo-random signals of the maximum sequence length can be produced. The shift register 32, when initialized by the initializing signal R into a predetermined state where not all bits are 0, produces a certain pseudo-random sequence in synchronization with the sync signal C.

AND circuits $33_1, 33_2, \ldots,$ and $33_L$ are each supplied with a different combination of output signals from some or all of the bit-positions in the shift register 32, or inverted signals thereof. Thus the AND circuits $33_1, 33_2, \ldots,$ and $33_L$ generate the pseudo-random sequence generated in the shift register 32 as pseudo-random signals differing in timing from one another. OR circuits $34_1, 34_2, \ldots,$ and $34_M$ are each supplied with a different combination of the output signals of the AND circuits $33_1, 33_2, \ldots,$ and $33_L$. The OR circuits $34_1, 34_2, \ldots,$ and $34_M$ are thus intended for superimposing the pseudo-random signals led out by the AND circuits $33_1, 33_2, \ldots,$ and $33_L$ and differing in timing from one another and thereby adjusting them to a proper frequency of pulse generation. The number of the OR circuits $34_1, 34_2, \ldots, 34_M$ is equal to the bit number (M) of the feedback inputs Y'', and each OR circuit generates a different pseudo-random signal, which is supplied to a respective one of the signal lines 106.

Referring to FIG. 3 showing a detailed block diagram of the register 2, master-slave type flipflops $23_1, 23_2, \ldots,$ and $23_M$ are initialized in a predetermined state by the initializing signal R, and driven by the sync signal C. EXOR circuits $22_1, 22_2, \ldots,$ and $22_M$ lead the flip-flop driving signals Y to respective flipflops $23_1, 23_2, \ldots,$ and $23_M$. AND circuits $21_1, 21_2, \ldots,$ and $21_M$, in accordance with the instruction of the mode switching signal A, determine whether or not to transmit the content of the preceding flipflop to the following. An EXOR circuit 24 is supplied with the outputs of predetermined flipflops, i.e., of the flipflops $23_2$ and $23_M$, and generates and supplies the feedback signal to the flipflop $23_1$.

The function of the register 2 will be described below, first in its routine operating mode. When the mode switching signal A is of logical "0", all the outputs of the AND circuits $21_1, 21_2, \ldots,$ and $21_M$, which respectively are the inputs of the EXOR circuits $22_1, 22_2, \ldots,$ and $22_M$, are logical "0", with the result that the flip-flop driving signals Y are passed intact through the EXOR circuits $22_1, 22_2, \ldots,$ and $22_M$ to the inputs of the respective flipflops $23_1, 23_2, \ldots,$ and $23_M$. This enables the flipflops $23_1, 23_2, \ldots,$ and $23_M$ to operate independently of one another as internal memory elements of the sequential circuit.

Next will be described its function in the testing mode. With the mode switching signal A turned to logical "1", the AND circuit $21_1$ transmits the feedback signal from the EXOR circuit 24 to the input of the first flipflop $23_1$ through the EXOR circuit $22_1$. Each of the AND circuits $21_2, \ldots,$ and $21_M$ conveys the content of the preceding flipflop to the following, so that the flipflops $23_1, 23_2, \ldots,$ and $23_M$ operate as a feedback shift register. Further, the flipflop driving signals Y are superimposed on the feedback signal by passing through the EXOR circuits $22_1, 22_2, \ldots,$ and $22_M$. Generally, since a feedback shift register changes its memory content depending on previously impressed signal sequences, it has the effect of compressing long signal sequences. Accordingly, when the feedback shift register is initialized by the initializing signal R and driven by the sync signal C for a certain period of time, the signal sequence in the flipflop driving signal Y is compressed and stored as specific bit patterns in the flipflops $23_1, 23_2, \ldots,$ and $23_M$. The signal sequence led to the output line 110 of the flipflop $23_M$, whose sequence-length is equal to the number (M) of the flipflops $23_1, 23_2, \ldots,$ and $23_M$, is equivalent to the information stored in the flipflops $23_1, 23_2, \ldots,$ and $23_M$. This principle is utilized for fault detection.

The operation of the integrated logic circuit 100 will be comprehensively described below, again with reference to FIG. 1. For routine function, the mode switching signal A is set at logical "0". Then, the register 2 operates merely as memory elements for the internal conditions of the circuit 100, and the multiplexer 4 supplies the output Y'' of the register 2 as the feedback input Y' of the combinational circuit 1, so that the circuit 100 constitutes a regular sequential circuit and is enabled to perform its routine function.

For the testing mode, the mode switching signal A is set at logical "1" so that the register 2 constitutes a feedback shift register and serves as a signal compressor, and the multiplexer 4 supplies the random signal from the random signal generator 3 to the combinational circuit 1. When the sync signal C is supplied after applying the initializing signal R to the random signal generator 3, the random signal generator 3 generates and supplies the combinational circuit 1 with certain pseudo-random signals. At the same time, the external input X is supplied to the combinational circuit 1, which provides the external output Z and the flipflop driving signal Y. The signal Y is compressed and stored in the feedback register 2. The content stored in the register 2 can be inspected by observing the signal sequences successively coming out on the signal line 110, so that the test results can be easily assessed.

Further to illustrate the effects of the present invention, one example of the testing method for the integrated logical circuit 100 will be described below with reference to FIG. 4. A testing device 200 is intended for testing the integrated logic circuit 100 and comprises a test signal generator 202, expected value registers 203 and 206, a signal sequence compressor 204, a shift register 205 and comparators 207 and 208. The test signal generator 202 for providing a prescribed test input may be similar to the random signal generator 2 (FIG. 3). The signal sequence compressor 204 for compressing and storing the external output Z of the integrated logic circuit 100 may be structured similarly to the register 2 (FIG. 3).

Testing is achieved by indirectly comparing the output results of a master integrated logic circuit which has been confirmed to correctly function and those of the integrated logic circuit which is to be tested. To distinguish the two from each other, the former will be hereinafter referred to with numeral 100, and the latter with 100'.

In the testing procedure, first the master integrated logic circuit 100 is properly set. After impressing the initializing signal R in the testing mode, the sync signal C is supplied to the integrated logic circuit 100 and the test signal generator 202. The test input generated by the test signal generator 202 is applied to the circuit 100. The output Y of the integrated logic circuit 100 is compressed by the register 2 (FIG. 3) and successively derived at the signal line 110. The signal at the line 110 is shifted into the shift register 205 for storing. The output Z of the integrated logic circuit 100 is compressed by and stored in the signal sequence compressor 204. After the above procedure has been completed, the data stored in the signal sequence compressor 204 and shift register 205 representing the output results of the correctly-operated master integrated logic circuit 100, are then transferred to the expected value registers 203 and 206, respectively.

Next, the integrated logic circuit 100' to be tested is properly set and subjected to exactly the same procedure as described above. The output results of the integrated logic circuit 100' are compressed and stored in the signal sequence compressor 204 and the shift register 205. After that, the content of the signal sequence compressor 204 is compared with that of the expected value register 203, and the content of the shift register 205 is compared with the content of the expected value register 206, by the comparators 207 and 208, respectively, to check whether the corresponding contents are coincident with each other. If both the comparators 207 and 208 give outputs indicating coincidence, the integrated logic circuit 100' can be considered highly probable to be a satisfactory product. If, conversely, at least one of the comparators 207 and 208 gives an output indicating the incoincidence, the integrated logic circuit 100' will be judged faulty.

Figure 5:
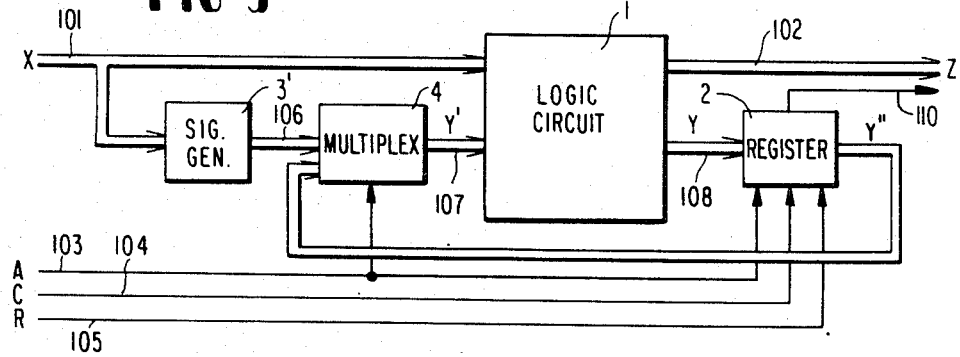
FIG. 5 is a block diagram of a second embodiment of this invention.

Referring to FIG. 5, the second embodiment comprises a random signal generator circuit 3' to which some or all of the external input X is supplied, and is exactly the same in all other components as the first embodiment illustrated in FIG. 1.

Figure 6:
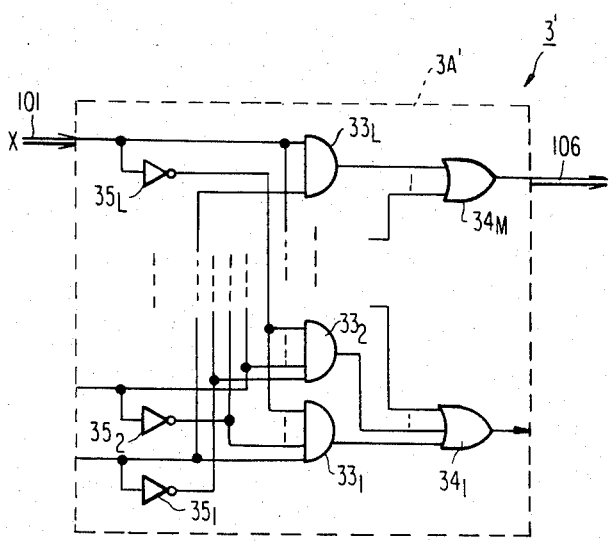
FIGS. 6 and 7 are block diagrams of first and second examples, respectively, of the random signal generator 3' used in the second embodiment shown in FIG. 5.

With reference to FIG. 6, a first example 3A' of the random signal generator 3' has NOT circuits $35_1, 35_2, \ldots,$ and $35_N$ for inverting the external input X, AND circuits $33_1, 33_2, \ldots,$ and $33_L$ for picking out different combinations of the signals of the external input X and the inverted signals thereof, and OR circuits $34_1, \ldots,$ and $34_M$ for picking out different combinations of the outputs of the AND circuits $33_1, 33_2, \ldots,$ and $33_L$.

When a signal sequence is supplied to the external input X, a specific combination of signals is detected in each of the AND circuits $33_1, 33_2, \ldots,$ and $33_L$ and conveyed to the output. The signal sequences from the AND circuits $33_1, 33_2, \ldots,$ and $33_L$ at different timings are applied to the OR circuits $34_1, \ldots,$ and $34_M$ and adjusted a proper frequency of pulse generation.

At the output of each OR gate $34_1, \ldots,$ and $34_M$ is obtained a signal sequence resulting from the conversion of the external input X into a pseudo-random sequence, which is supplied to the signal line 106. Then a random signal sequence is supplied as the external input X, the circuit 3A' generates another random signal sequence.

Figure 7:
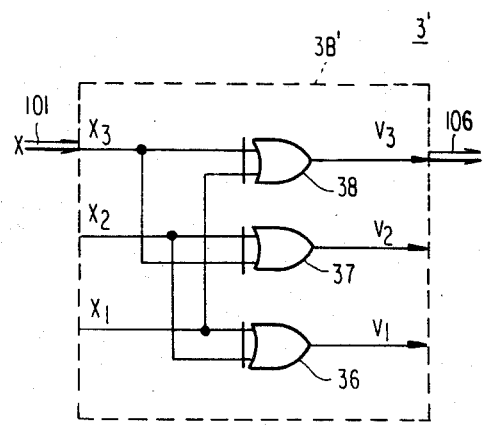
Figure 8:
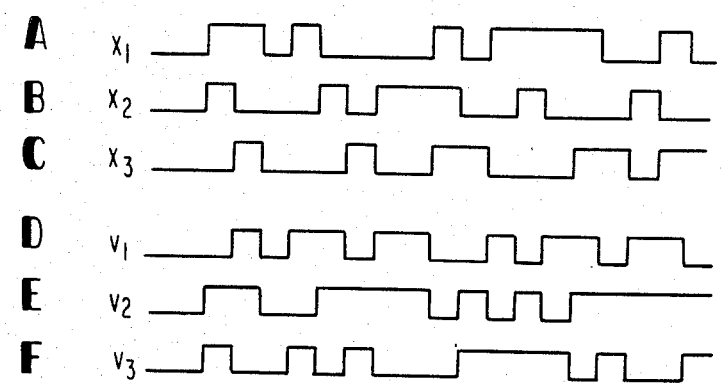
FIGS. 8A through 8F are waveform diagrams of signals appearing at various parts of the second example of the random signal generator 3' shown in FIG. 7.

Referring to FIG. 7, a second example 3B' of the random signal generator circuit 3' has three EXOR circuits 36, 37 and 38. When external inputs $X(X_1, X_2, X_3)$ shown in FIGS. 8A–8C are supplied to the EXOR circuits 36–38, the outputs of the random signal generator circuit 3B' (outputs of the EXOR circuits 36–38) provide different signal sequences V ($V_1, V_2, V_3$) shown in FIGS. 8D–8F.

The second embodiment is characterized in that it further randomizes the test input impressed as external input and thereby obtains another test input which has to be inserted into the feedback loop.

In the two embodiments described above, testing is facilitated by restructuring the existing flipflops into the feedback shift register to permit observation of signals in the circuit, especially those concerning the feedback loop. Additional observation of specifically designated signals in the circuit helps further improve the testing efficiency. In the PLA referred to above, for example, the output of the product term line of the AND logic array can give useful information for testing. Such embodiments will be described hereunder.

Figure 9:
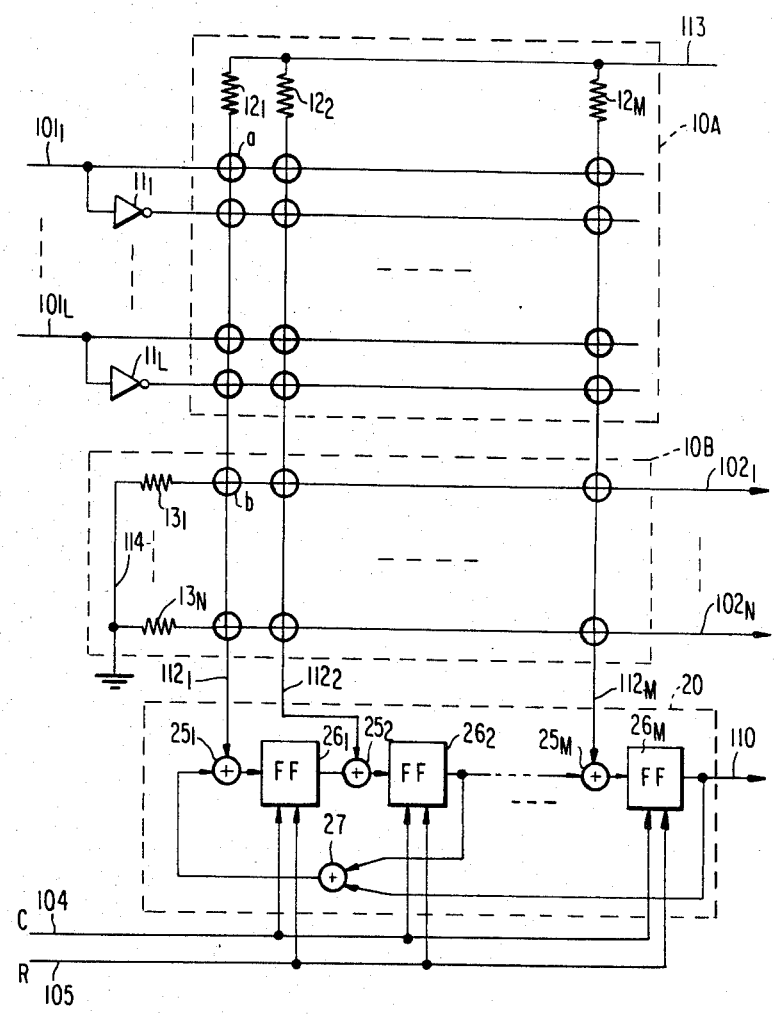
FIG. 9 is a block diagram of a third embodiment of this invention.

Referring to FIG. 9, a third embodiment has an AND logic array 10A and an OR logic array 10B each consisting of a programmable diode matrix. Each of the intersections a and b of the diode matrices of the logic arrays 10A and 10B, as illustrated in FIG. 10, has a diode 13 and a fuse 14. It is made possible to program said logic arrays 10A and 10B as desired by, for instance, electrically cutting off the fuse 14.

External input signals impressed on the AND logic array 10A through external input signal lines $101_1, \ldots,$ and $101_L$ are of binary signals. NOT circuits $11_1, \ldots,$ and $11_L$ are supplied with the binary signals from the external input signal lines $101_1, \ldots,$ and $101_L$, and supply the inverted binary signals to other input signal lines of the AND logic array 10A. At output signal lines $112_1, 112_2, \ldots,$ and $112_M$ of the AND logic array 10A are obtained the logical products of the binary signals given to the external input signal lines $101_1, \ldots,$ and $101_L$ by the logical combinations programmed in the AND logic array 10A. Thus, the lines $112_1, 112_2, \ldots,$ and $112_M$ are product term lines. From a power supply line 113 is fed a positive voltage. One end each of resistors $12_1, 12_2, \ldots,$ and $12_M$ is connected to the power supply line 113, and the other to the product term lines $112_1$, $112_2$, . . . , and $112_M$, to drive them. Signal lines $102_1$, . . . , and $102_M$ i.e., the output signal lines of the OR logic array 10B constitute output signal lines to transmit the two-value outputs of this integrated logical operation circuit. One end each of resistors $13_1$, . . . , and $13_N$ is connected to a grounding conductor 114, and the other to the external output signal lines $102_1$, . . . , and $102_N$.

A feedback shift register 20 added to facilitate testing in accordance with the present invention has EXOR circuits $25_1$, $25_2$, . . . , and $25_M$ and master-slave type flipflops $26_1$, $26_2$, . . . , and $26_M$. A multi-input EXOR circuit or modulo 2 adder 27 produces a feedback signal by modulo 2 addition of the output signals of one or more flipflops in a predetermined position or positions out of the flipflops $26_1$, $26_2$, . . . , and $26_M$. The output signal of the product line $112_1$ undergoes modulo 2 addition to the output signal of the adder 27 in the EXOR circuit $25_1$, and the output of the EXOR circuit $25_1$ is conveyed to the input of the first flipflop $26_1$. The output signal of the product term line $112_2$ undergoes modulo 2 addition to that of the preceding flipflop $26_1$ in the EXOR circuit $25_2$, whose output is conveyed to the input of the following flipflop $26_2$, and similarly the output signal of each of the subsequent product term lines until $112_M$ undergoes modulo 2 addition to the output of the preceding flipflop and is conveyed to the following flipflop.

The flipflops $26_1$, $26_2$, . . . , and $26_M$ are initialized in a predetermined state by the initializing signal R. The output line 110 of the final flipflop $26_M$ is connected to an external terminal. Generally, since a feedback shift register changes its memory content depending on previously impressed signal sequences, it has the effect of compressing long signal sequences. Accordingly, when this feedback shift register 20 is initialized and driven by the sync signal C for a certain period of time, the signal sequences emerging on the product term lines $112_1$, $112_2$, . . . , and $112_M$ are compressed and stored as specific bit patterns in the flipflops $26_1$, $26_2$, . . . , and $26_M$. The signal sequence at the output line 110 of the final flipflop $26_M$ can be applied to and observed with a shift register (for example, 205 in FIG. 4) having as many bits as the number of flipflops $26_1$, $26_2$, . . . , and $26_M$.

If there is any fault at, for instance, the intersection a of the diode matrices of the AND logic array 10A and said intersection a is excited by said test input signal sequence, erroneous signals will be generated on the product term line passing said intersection a, i.e. the results of said AND operation will be erroneously supplied. Accordingly, the results accumulated in the feedback shift register 20 will differ from normal results and the signal sequence led out to the signal line 110 will also differ from the normal sequence. The foregoing description has made apparent how easily any fault in the AND logic array 10A can be detected.

Any fault in the OR logic array 10B can be easily detected because its output signal lines $102_1$, . . . , and $102_M$ are directly observable from outside. The third embodiment has an advantage that the information obtained on the product term lines $112_1$, $112_2$, . . . , and $112_M$, not directly observable from outside, is made indirectly accessible through the feedback shift register 20 and accordingly the AND logic array 10A and OR logic array 10B are in effect separately inspected, resulting in greater testing accuracy.

Where the PLA has a built-in register, provision of a means capable of having the register operate as a feedback shift register would make the PLA exactly the same as the first or second embodiment.

Referring to FIG. 11 showing the fourth embodiment, signals on output signal lines $102_1'$, . . . , and $102_p'$ of the OR logic array 10B drive an internal register 41, whose output signals are applied through lines $101_1'$, . . . , and $101_p'$ to the AND logic array 10A as the internal feedback signals. NOT circuits $11_1'$, . . . , and $11_p'$ invert the internal feedback signals and impress and inverted signals on some of the inputs of the AND logic array 10A. The PLA with a built-in register thereby constitutes a sequential circuit.

A feedback register 20' is structured similarly to the feedback shift register 20 in FIG. 9. The EXOR circuits $25_1'$, . . . , and $25_p'$ are supplied with the internal feedback signals and EXOR circuits $25_1$, . . . , and $25_M$ with the signals from the product term lines $112_1$, . . . , and $112_M$ of the AND logic array 10A. The EXOR circuits 25' and 25 individually perform modulo 2 additions. The feedback shift register 20' compresses and stores signal sequences emerging on the signal lines $101_1'$, . . . , and $101_p'$ and on the product term lines $112_1$, . . . , and $112_M$.

Figure 12:
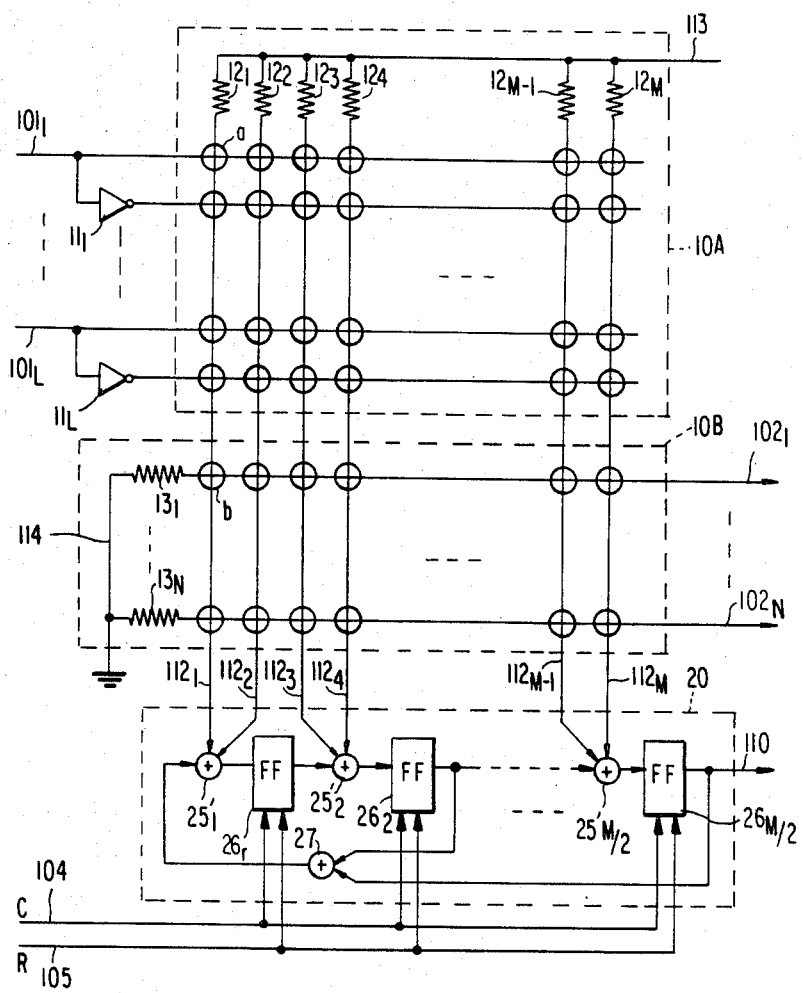

Referring to FIG. 12 illustrating a fifth embodiment, the output lines are divided into pairs, such as the product term line pairs $112_1$ and $112_2$, $112_3$ and $112_4$, . . . , and $112_{M-1}$ and $112_M$. EXOR circuits $25_1'$, $25_2'$, . . . , and $25_{M/2}'$ and flipflops $26_1'$, $26_2'$, . . . , and $26_{M/2}'$ are so arranged as to respectively correspond to the product term line pairs $112_1$ and $112_2$, $112_3$ and $112_4$, . . . , and $112_{M-1}$ and $112_M$. The multi-input EXOR circuit 27 produces the feedback signal by modulo 2 addition of the output signals of one or more flipflops in a predetermined position or positions of the flipflops $26_1'$, $26_2'$, . . . , and $26_{M/2}'$. The fifth embodiment is structured and functions in exactly the same manner as the third embodiment except that the production term lines are paired here.

What calls for attention with respect to the fifth embodiment is that the pairing of product term lines may invite the simultaneous supplying of erroneous signals to a plurality of product term lines with the result that these errors will be overlooked and this problem will be considered hereunder. This disadvantage derives from the modulo 2 addition of a pair of product term lines. When, for instance, the product term lines $112_1$ and $112_2$ simultaneously give erroneous signals, the output of the EXOR circuit $25_1$ is the same as what it ought to be, and generally when erroneous signals are simultaneously supplied by an even number of product term lines out of a plurality of such lines belonging to one group, these errors are overlooked. However, the probability of the constant occurrence of an even number of erroneous signals is likely to be extremely small if a sufficiently large number of test input signals are used, though said probability depends in part on the number of product term lines belonging to one group. The occurrence of such a state can further be avoided by so selecting test input signals as to excite specific product term lines. If two product term lines give exactly the same output signals, including erroneous lines, in response to all combinations of input signals, the logical products programmed on these two product term lines will be identical, and by programming such logical products on product term lines belonging to different pairs, a state in which said errors are overlooked can be averted. The problem thus results in no significant invites disadvantage to the present invention.

To sum up the foregoing description, the advantages of the present invention include the applicability of such easily available random test input signals, accumulation of the test results in a feedback shift register consisting of a group of flipflops, and facilitation of testing by making possible observation with a single signal line without substantially increasing the number of output lines (terminals). Another advantage of this invention is that, since the test results need not be examined one by one but fault detection is possible merely from the final results of a series of testing procedures, the testing can be accelerated without waste of time in the testing process.

The present invention therefore proves particularly effective when applied to such an integrated logic circuit as one formed on a single chip, which does not permit direct observation of its internal structure and is restricted in the number of input and output terminals.

It also is possible to apply this invention to an integrated logic circuit having a regular structure, such as a PLA.

What is claimed is:

1. An easily testable integrated logic circuit, comprising:
    a combinational logic circuit receiving a plurality of first inputs and a plurality of second inputs for providing logic outputs;
    a feedback shift register having an output and including a plurality of first through n-th series-connected flip-flops each having an input and an output, said flip-flops receiving in parallel at least a portion of said logic outputs from said combinational logic circuit and advancing said outputs in series through said first through n-th flip-flops while feeding an output from at least one of said flip-flops back to the input of another of said flip-flops to thereby compress a signal sequence in said logic outputs, the output of any one of said flip-flops constituting the output of said feedback shift register; and
    means for selectively disconnecting the series connection of said flip-flops whereby each of said flip-flops receives and stores a respective one of said portion of said logic outputs received in parallel from said combinational logic circuit, at least a portion of said outputs of said flip-flops being fed back in parallel as said second inputs to said combinational logic circuit when said series connection of said flip-flops is disconnected.

2. An easily testable integrated logic circuit as claimed in claim 1, wherein said logic outputs provided by said combinational logic circuit include first and second groups of logic outputs, said flip-flops receiving in parallel only said second group of logic outputs.

3. An easily testable integrated logic circuit as claimed in claim 2, further comprising means for determining the existence of an error in said combinational logic circuit in accordance with at least said feedback shift register output.

4. An easily testable integrated logic circuit as claimed in claim 1, further comprising means for determining the existence of an error in said combinational logic circuit in accordance with at least said feedback shift register output.

5. An easily testable integrated logic circuit, comprising:
    a combinational logic circuit receiving a plurality of first inputs and a plurality of second inputs for providing first and second groups logic outputs;
    a feedback shift register having an output and including a plurality of first through n-th series-connected flip-flops each having an input and an output, said flip-flops receiving in parallel only said second group of said logic outputs from said combinational logic circuit and advancing said outputs in series through said first through n-th flip-flops while feeding an output from at least one of said flip-flops back to the input of another of said flip-flops to thereby compress a signal sequence in said logic outputs, the output of any one of said flip-flops constituting the output of said feedback shift register; and
    means for determining the existence of an error in said combinational logic circuit in accordance with said feedback shift register output and said first group of logic outputs from said combinational logic circuit.

* * * * *

UNITED STATES PATENT AND TRADEMARK OFFICE
CERTIFICATE OF CORRECTION

PATENT NO. : 4,536,881

DATED : August 20, 1985

INVENTOR(S) : Yoshihiro KASUYA, Tokyo, Japan

It is certified that error appears in the above-identified patent and that said Letters Patent is hereby corrected as shown below:

Column 1, line 34, change "capable or" to --capable of--.

Column 4, line 60, after "signal" insert --sequence--.

Column 5, line 16, change "generator 2" to --generator 3--;

line 16, change "(FIG. 3)" to --(FIG. 2).

Column 6, line 19, change "Then" to --When--.

Column 8, line 67 & 68, delete "invites".

Signed and Sealed this

Eighteenth Day of March 1986

[SEAL]

Attest:

DONALD J. QUIGG

Attesting Officer

Commissioner of Patents and Trademarks